United States Patent [19]

Diaz et al.

[11] Patent Number: 4,928,199
[45] Date of Patent: May 22, 1990

[54] CIRCUIT PROTECTION DEVICE

[75] Inventors: Stephen H. Diaz, Los Altos Hills; Gabe Cherian, Fremont; Stephen Morris, Los Altos, all of Calif.; John R. Vinson, Cricklade, nr. Swindon, England; David Crofts; Anthony J. Moore, both of Cirencester, England

[73] Assignee: Raychem Limited, United Kingdom

[21] Appl. No.: 405,409

[22] Filed: Sep. 11, 1989

Related U.S. Application Data

[63] Continuation of Ser. No. 159,473, Feb. 16, 1988, abandoned, which is a continuation of Ser. No. 71,537, Jul. 9, 1987, abandoned, which is a continuation of Ser. No. 842,108, Mar. 20, 1986, abandoned.

[30] Foreign Application Priority Data

Mar. 29, 1985 [GB] United Kingdom ............... 8508304

[51] Int. Cl.$^5$ ............................................ H02H 9/04
[52] U.S. Cl. ........................................ 361/56; 361/58;
361/91; 361/111; 361/401; 252/62.35;
357/23.13
[58] Field of Search ............... 361/56, 58, 88, 91,
361/93, 100, 110, 111, 401, 402; 357/23.13, 2;
252/62.35

[56] References Cited

U.S. PATENT DOCUMENTS

| | | | |
|---|---|---|---|
| 3,343,034 | 9/1967 | Ovshinsky | 317/11 |
| 3,435,255 | 3/1969 | Jensen | 307/258 |
| 3,436,601 | 4/1969 | Dyre | 317/61.5 |
| 3,530,441 | 9/1970 | Ovshinsky | 340/173 |
| 3,920,461 | 11/1975 | Asahara et al. | 106/47 R |
| 3,983,076 | 9/1976 | Rockstad et al. | 252/518 |
| 3,999,159 | 12/1976 | Matsuura et al. | 338/21 |
| 4,023,071 | 5/1977 | Fussel | 361/56 |
| 4,089,032 | 5/1978 | Dell Orfano | 361/56 |
| 4,236,188 | 11/1980 | Prochazka | 361/111 |
| 4,559,579 | 12/1985 | Val | 361/91 |

OTHER PUBLICATIONS

Phillip et al., J. Appl. Phys., 52(2), Feb. 1981, pp. 1083-1090, *ZnO Varistors for Protection Against Electromagnetic Pulses.*
Callarotti et al., "Thin Solid Films 90" (1982), pp. 379-384, *Transmission Line Protection with Thin Film Chalcogenide Glass Devices.*
Adler et al., J. Appl. Phys., 51(6), Jun. 1980, pp. 3289-3309, *Threshold Switching Chalcogenide-Glass Films.*
Pinto et al., App. Phys. Lett., 19 (7), 1971, *Electric Field Induced Memory Switching in Thin Films of the Chalcogenide System Ge-As-Se.*

*Primary Examiner*—Todd E. Deboer
*Attorney, Agent, or Firm*—Herbert G. Burkard; Bernard J. Lyons

[57] ABSTRACT

A circuit protection device for protecting electrical circuits against voltage transients comprises a chip package which includes a threshold switch device formed from an amorphous composition.

4 Claims, 6 Drawing Sheets

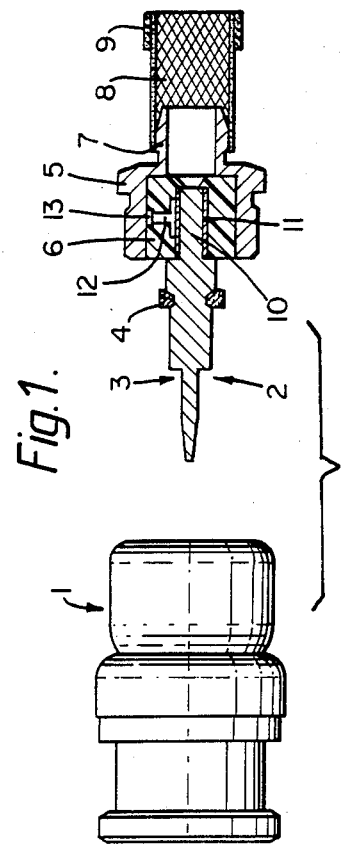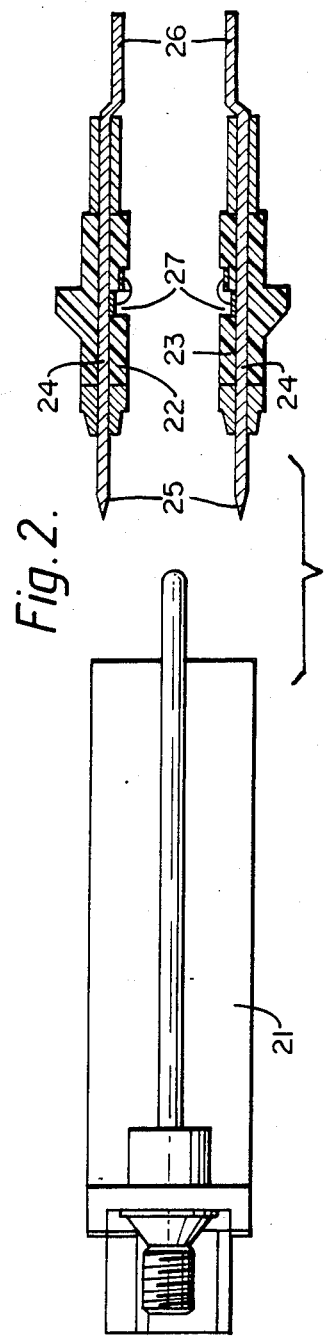

CIRCUIT PROTECTION DEVICE

This is a continuation of application Ser. No. 07/159,473, filed 2/16/88, now abandoned, which is a continuation of application Ser. No. 071,537, filed 7/9/87, now abandoned, which is a continuation of application Ser. No. 842,108 filed 3/20/86, now abandoned.

This invention relates to circuit protection devices, and especially to devices for protecting electri- circuits against voltage transients that are caused by an electromagnetic pulse, e.g. lightning, and also the transients that are caused by electrostatic discharge.

Electrostatic discharge and electromagnetic pulses can all induce very high currents and voltages on cables and structures such as aeroplanes and ships, which can penetrate the electrical systems and damage them, either causing hardware damage such as semiconductor burnout, or electronic upset, e.g. transmission loss or loss of stored data. As semiconductor technology advances, the energy needed to cause such damage becomes less.

The most severe threat to electrical and electronic equipment is the electromagnetic pulse although all effects can generate large voltage or current spikes with very short rise times. The exact characteristics of the pulse are complicated although a typical pulse will exhibit a field strength of about $10^5$ Vm$^{-1}$ with an accompanying H field intensity of 270 Am$^{-1}$ (based on free space impedance of 377 ohms), a pulse width of a few microseconds and a rise time of a few nanoseconds. In general damaging amplitudes in the pulse occur within the frequency range of 10KHz to 100MHz.

In order to protect electrical circuits from such threats it would be desirable to incorporate therein a circuit protection device which, in normal operation, has a high resistance but which, when the circuit is subjected to a voltage surge, quickly changes to a low resistance state in order to short the current surge to earth, and, after the current surge has finished, immediately reverts to its high resistance state. Based on the electrical characteristics of the pulse and the nature of the equipment it is intended to protect, it is possible to determine what characteristics of a circuit protection device are necessary for it to be able successfully to protect the circuit against the pulse damage. For example, one set of guidelines published by H.R. Philipp and L.M. Levinson in J. Appl Phys 52(2) February 1981 pp. 1083 to 1090, the disclosure of which is incorporated herein by reference, specifies inter alia the following requirements for a surge arrestor material that is intended to short a voltage transient to earth:

- Threshold voltage: 100V
- Switching delay time: <1 nanosecond
- Current capacity: up to 400 A
- Insertion loss: <0.4 dB at 0 to 200 MHz <0.8 dB at 200 to 500MHz
- Size limit: 1 cm The insertion loss, or attenuation of an electrical signal, at any frequency may be determined from the capacitance of the device, and it is this value of attenuation which is required to determine the suitabi lity of any protection device. Since the switching device will comprise a normally insulating switching element located between a pair of conductive electrodes, the capacitance of the device (assuming parallel plate configuration) is given by $$C = \epsilon_0 \epsilon_r . A . t^{-1}$$

where C is the capacitance; $\epsilon_0$ is the absolute permitivity of free space ($8.85 \times 10^{-12}$Fm$^{-2}$; $\epsilon_r$ is the relative permitivity of the dielectric; A is the cross-sectional area (in meters), and t is the thickness of the dielectric (in meters);

and the insertion loss, measured in decibels, is given by:

$$\text{Insertion loss} = \log_{10}[V_1/V_2]$$

where $V_1/V_2$ is the ratio of the signal intensity without the device to that with the device, and is given by:

$$V_1/V_2 = [1 + (2\pi f C R)^2]^{\frac{1}{2}}$$

where f is the frequency of the signal (in Hertz); and R is the characteristic impedance.

In addition to these requirements, the device will need a resistance in normal operation of at least about $10^6$ ohms in order to allow the equipment to function correctly.

One class of material that has been proposed for use in the manufacture of circuit protection devices in general are the chalcogenide glasses, by which is meant glasses formed from elements of group VIB of the periodic table (IUPAC 1965 revision) together with other elements, especially those of groups IVB and VB, for example as described in U.S. Pat. No. 3,271,591 to Ovshinsky. Certain of these glasses can be used to form "threshold" devices by which is meant devices that will change from a high resistance state to a low resistance state on application of a high voltage but which will remain in their low resistance state only for as long as a small "holding" current is maintained. Other chalcogenide glasses can be used to form "memory" devices which will change from a high resistance state to a low resistance state on application of a high voltage and which will remain in the low resistance state, even when no voltage is applied, until an appropriate, different, voltage pulse is applied. As will be appreciated, only threshold devices are appropriate for the production of circuit protection devices.

The chalcogenide glass materials have the advantage that they exhibit very short switching times between their high and low resistance states, typically less than 1 nanosecond, which is sufficiently fast for protecting circuits from the transient. However, they suffer from a number of disadvantages that, hitherto, have prevented their use for such purposes. The shortcomings of such devices may be seen by comparing the properties of a typical glass with the properties required of a circuit protection device to meet the guidelines mentioned above (although it will be appreciated that other guidelines may require different properties). For example a typical chalcogenide glass material (for example Te$_{48}$As$_{30}$Si$_{12}$Ge$_{10}$ described in U.S. Pat. No. 3,271,591) has the following properties:

| Dielectric constant | | 10 |
|---|---|---|
| High resistance resistivity | off | $10^7$ ohm cm |
| low resistance resistivity | on | 0.07 ohm cm |
| threshold field strength | V$_{th}$ | $4 \times 10^5$ Vcm$^{-1}$ | where the threshold field strength is the field strength across the device required to switch the glass to its low resistance (on resistance) state.

The minimum area needed for a device comes from a knowledge of the maximum current density that the materials can stand and the maximum current flow in a transient, and is given by:

$$\text{Minimum Area} = \frac{EMP \text{ Current}}{\text{max. current density}}$$

The maximum current density is of the order of $2 \times 10^4 \text{Acm}^{-2}$ (See D. Adler et al, J. Appl Phys vol 51(6) 1980 P. 3289 to 3309) whilst the maximum current is as mentioned above from Philipp and Levinson, up to 400A.

Hence, for example, the device would need a cross-section of at least 2mm² to exhibit the required current capacity of 400A given by the guidelines but for a required current capacity of 200A, a minimum area of 1mm² is needed. In practice, the smallest area that is compatible with the current density is preferred in order to minimise the capacitance of the device and hence the insertion loss. Also, since the threshold field strength of the glass is $4 \times 10^5 \text{Vcm}^{-1}$, the device would need a maximum thickness of 2.5 micrometers in order to exhibit a threshold voltage of 100V. However, such a device would have a normal high resistance state resistance (off resistance) of $2.5 \times 10^5$ ohms which is far too low for normal operation of the equipment, and would also exhibit an insertion loss for frequencies up to 200 MHz of 6dB. If the thickness of the device were increased to give an acceptable insertion loss, the threshold voltage would be raised to 1000V, while if the thickness were increased to give an acceptable off resistance the threshold voltage would be raised to 10000V. Although it is possible to reduce the threshold field strength of the glass by appropriate choice of formulation, we have found that, in the previously proposed materials, other properties of the material are seriously impared.

According to one aspect, the invention provides a threshold device for protecting an electrical circuit which includes a switching element that exhibits an energy to latch of at least 40, preferably at least 60 and especially at least 100 mJ (for a 10 micrometre thickness) and is formed from an amorphous composition comprising germanium, selenium and arsenic, the composition having a figure of merit (as hereinafter defined) of at least 5 $\text{kgm}^3\text{s}^{-2}\text{A}^{-1}$.

We have found that it is possible to form threshold switches from such chalcogenide glasses that have a balance of properties that enable them to be used successfully for protecting equipment from voltage transients. For example, we have found that the threshold field strength of these glasses are, in general, lower than $4 \times 10^5$ Vcm$^{-1}$ and can be in the order of $1 \times 10^5$ Vcm$^{-1}$. Furthermore the off resistivity of the glasses can be in the order of $10^8$ ohm cm as compared with $10^7$ ohm cm for the previously proposed glasses. Thus it is possible to form circuit protection devices that are acceptable by appropriate choice of the glass optionally together with dimensional control of the device, for example by increasing the thickness of the chalcogenide glass switching element e.g. to 10 to 30 micrometres.

The threshold field strength of the element combined with the other properties thereof causes the threshold voltage of the device to remain at an acceptable value e.g. from 70 to 300V, while the increased off resistivity of the element enables an acceptable normal resistance value of about 10⁶ ohms to be achieved. Indeed, the fact that these glasses act as threshold devices at all is contrary to previous references to these materials (R. Pinto J. Non-Crystalline Solids 6(1971) 187-196, R. Pinto Thin Solid Films 7(1971) 391, J.P. deNeufville et al 5the International Conference on Amorphous and liquid semiconductors 1973 Vol 2 pp. 737-743 and U.S. Pat. No. 3,530,441 to Ovshinsky) in which the glasses are described only as memory materials.

In addition, by the use of materials defined above it is possible to overcome one significant problem that has hitherto been largely ignored or has not been appreciated in connection with circuit protection: although such devices will often revert to their high resistance state as soon as the transient voltage has subsided, it is easily possible for a device to be forced permanently into its low resistance state if the energy of the transient is large or if a number of rapid transients are experienced. In fact, the energy needed to "latch" the previously proposed devices permanently into their conductive state is relatively low and is often less than the expected energy of the transient against which the device is intended to provide protection. Thus, although the electrical and electronic equipment would be protected against the transient, the equipment would not then operate until the protection device is replaced or reset. In contrast, the materials used in the devices according to the present invention exhibit a relatively high energy to latch and often considerably higher than that exhibited by any of the previously proposed materials. The "energy to latch" or "latching energy" is defined herein as the electrical energy required to force the switching element or the glass composition permanently into its low resistance state. Some values for the energy to latch are quoted herein in units of energy (mJ), and such values refer to glass compositions of 10 micrometer thickness and 1mm² area. *It is believed that the energy to latch is substantially proportional to the thickness of the glass, at least at thicknesses of this order of magnitude, and independent of the area, at least for areas of this order of magnitude, and so other values herein may be quoted in units of energy per thickness of the glass. Preferably the materials have an energy to latch of at least* 2000, more preferably at least 5000 and especially at least 10,000 Jm$^{-1}$ (or, more correctly, microjoules micrometer$^{-1}$).

The particular value desired for any property of the material used in the device according to the invention will depend, at least to some extent on the other properties of the material, and the choice of material may often represent a compromise between conflicting properties. We have found, however, that it is possible to define a property of the material, called herein the "figure of merit" which distinguishes those materials that may be used to form useful circuit protection devices from those that cannot be used. In some cases the figure of merit may be used alone to determine the suitability of a material although in many cases, depending on the expected threat to the equipment, the figure of merit should be used together with one or more other criteria. The figure of merit for the glass compositions is defined herein as follows:

$$\text{Figure of merit} = \frac{E_L \cdot \rho_{off}}{V_{th} \cdot \epsilon_r}$$

where $E_L$ is the energy required to latch the material in its low resistance state (measured in Joules per metre (of thickness) or microjoules per micrometer);

$\rho$off is the resistivity of the material in its high resistance state (measured in ohm meters);

$V_{the}$ is the threshold field strength of the material (measured in volts per meter); and $\epsilon_r$ is the dielectric constant of the material)

The materials used in the devices according to the present invention generally have a figure of merit of at least 5 units whereas those proposed in the prior art generally have a figure of merit below 0.3 and often below 0.1 unit. Preferably the material exhibits a figure of merit of at least 10, and more preferably at least 20 units (a unit being 1 $kgm^3s^{-2}A^{-1}$).

Alternatively or in addition, a figure of merit for the circuit protection device, rather than for the glass, may be defined as follows:

$$\text{Figure of merit} = \frac{E_L' \cdot R}{V \cdot C}$$

where $E_L'$ is the energy to latch of the switching element (measured in joules);

R is the high resistance state resistance of the switching element (measured in ohms);

V is the threshold voltage of the switching element (measured in volts); and

C is the capacitance of the switching element (measured in farads).

The device preferably has a figure of merit of at least $5 \times 10^{12}$, more preferably at least $1 \times 10^{13}$ and especially at least $2 \times 10^{13}$ $JA^{-1}F^{-1}$.

Preferably the composition contains at least 15 atomic % selenium but preferably not more than 75 atomic % selenium. The arsenic content is preferably at least 10 atomic % but preferably not more than 65 atomic %. In addition or alternatively, the composition preferably contains at least 5 atomic % germanium but not more than 42 atomic % germanium.

These glass compositions are particularly preferred, and so, according to another aspect, the invention provides a threshold device for protecting an electrical circuit which includes a switching element formed from an amorphous composition comprising:

(a) 15 to 75 atomic % selenium;
(b) 10 to 65 atomic % arsenic; and
(c) 5 to 42 atomic % germanium or, if the composition contains less than 35 atomic % selemium, 5 to 35 atomic % germanium in which the proportions of (a), (b) and (c) (based on the total molar quantity of (a , (b) and (c)) add up to 100%.

Preferably the composition contains not more than 35 atomic % germanium, more preferably not more than 30 atomic % germanium and especially not more than 25 atomic % germanium. Also, the composition preferably contains at least 20 atomic % selenium and especially at least 30 atomic % selenium but preferably not more than 70 atomic % selenium and especially not more than 60 atomic % selenium. The composition preferably contains at least 20 atomic % arsenic and especially at least 25 atomic % arsenic, but preferably not more than 60 atomic % arsenic and especially not more than 55 atomic % arsenic. Thus the composition preferably comprises:

(a) 20 to 70 atomic % selenium;
(b) 20 to 60 atomic % arsenic, and
(c) 5 to 30 atomic % germanium and most preferably comprises:

(a) 30 to 60 atomic % selenium;
(b) 25 to 55 atomic % arsenic; and
(c) 5 to 25 atomic % germanium.

All the proportions of the components (a), (b) and (c) are based on the total molar quantity of (a), (b) and (c) alone and total 100%.

It is possible for quantities e.g. up to 10% or sometimes more, of other materials to be present in the compositions used in the devices according to the invention, for example minor amounts of the elements antimony, bismuth, silicon, tin, lead, halogens and some transition metals provided that the presence of such materials does not deleteriously affect the properties, such as the energy to latch and/or off resistivity, to a significant degree. It is preferred, however, for the compositions to contain substantially no tellurium since the presence of tellurium has been found to reduce the off resistivity of the materials severely, although, in certain circumstances, small quantities of tellurium may be tolerated, e.g. up to 10 atomic %, but preferably less than 5 atomic %.

The dimensions of the switching element used in the device according to the invention will depend on the particular chalcogenide glass composition that is used to form it, although the thickness of the switching element will usually be not more than 40 micrometers, preferably not more than 20 micrometers, but usually at least 5 and preferably at least 10 micrometers. The cross-sectional area of the switching element, in a plane normal to the direction of current flow therethrough, will depend on the maximum current flow. It is preferably at least 0.5mm², the preferred size being about 1mm² for discrete devices and for the maximum pulse level, at least 2mm².

The devices may be incorporated in an electrical circuit in any suitable position, normally being connected between a current carrying line and earth, (the term "earth" in this context including any structure having an appropriate shape and/or capacity so that it can absorb the charge generated by the transient, and includes for example connection to the chassis and the like in vehicles such as aircraft), and, of course, more than one such device may be employed in the electrical circuit. The devices are conveniently incorporated in other electrical components for example electrical connectors, in which case the device will usually be connected between a current carrying element of the device and a terminal or other part of the device to be earthed e.g. a conductive housing.

Although in most instances the device will revert to its high resistance state as soon as the transient voltage has subsided, it is still possible for the device to be forced into a permanent low resistance state, for example if the voltage transient is unduly large or if a number of rapid transients are experienced. As mentioned above, whether or not the device will become permanently conductive depends on the amount of energy absorbed by the device from the transient. In some applications, for example in some ground installations, it may be desirable for the protection device to fail in this way, that is to say, so that the equipment is still protected against transients but will not function until the protection device is replaced or reset. In other applications, and especially in the case of aircraft, it may be essential that the device fails in a high resistance (open circuit) state so that the equipment will carry on functioning although unprotected from subsequent transients. Thus it is preferred, in some cases, for the device to be connected in series to means that will exhibit a high resistance to the intended electrical circuit current at least when the switching element has become permanently conductive. Thus, for example, the switching element may be connected to the current carrying line or to earth via a fuse or switch that is capable of transmitting currents passed through it when the switching element is in its threshold mode but will change to a high resistance state when the switching device has become permanently conductive.

Alternatively or in addition, the device may include a capacitor to ensure that the device exhibits a high resistance to all frequencies below the cut-off limit of the capacitor. The use of a capacitor in series with the switching element has a number of advantages as mentioned in our copending British Patent Application entitled "Overvoltage protection Device"filed on even date herewith (Agent's reference no. RK269), the disclosure of which is incorporated herein by reference. Briefly, the use of a capacitor of appropriate size, for example from 10pF to 100 microfarads in series with the switching element will enable the transient current to be transmitted to earth, since most of the power of the transient current occurs at frequencies above 10 kHz, but will exhibit a high impedance to the intended currents in the circuit which will have significantly lower frequencies or will be a direct current. Also, the use of a capacitor will prevent or significantly reduce the possibility of the switching element latching in its low resistance state after a transient has occurred. Such latching may occur in the absence of a capacitor due to current flow through the switching element keeping the switching element in its low resistance state. If a capacitor is used it is possible, in many cases, for only for a single capacitor to be employed in order to protect a number of lines if it is connected on the earth side of the switching elements, thereby allowing a greater degree of space saving.

Several embodiments of the invention will now be described by way of example with reference to the accompanying drawings, in which:

FIG. 1 is a side view, partly in section, of a BNC coaxial connector that incorporates a circuit protection device according to the invention;

FIG. 2 is a side view, partly in section, of a flat cable mass termination connector and wafers that incorporate a circuit protection device according to the invention;

Figure 3:
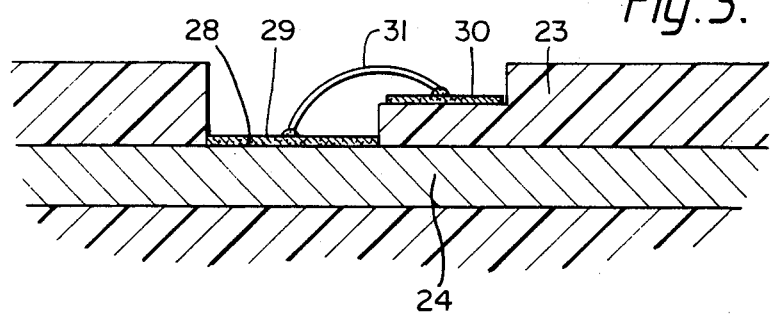
FIG. 3 is an enlarged view of part of the connector shown in FIG. 2.

Referring to FIG. 1 of the accompanying drawings, a connection arrangement for connecting two coaxial cables comprises a connector shell 1 and a male connector 2. The male connector 2 comprises a pin 3, the central and rear portion of which is hollow for receiving the central conductor of a coaxial cable to be connected (not shown). The pin has a fluxed solder ring 4 and a number of apertures (not shown) beneath the solder ring which communicate between the solder ring 4 and the hollow interior of the pin 3. The rear end 10 of the pin is firmly located in a connector housing 5 by means of an electrically insulating plastics spacer 6. The housing 5, which provides the electrical connection between the shields of the cables to be connected, has a termination portion 7 on which is mounted a solder impregnated braid 8 and solder ring 9.

The rear end 10 of the pin is provided on its outer surface with an electrode, e.g. a molybdenum electrode, followed by a 10 micrometer thick layer 11 of a selenium-germanium-arsenic glass described above that has been deposited thereon by a vapor deposition method, and the outer surface of the glass layer 11 has been provided with a further thin (about 5 micrometers thick) electrode, e.g. formed from molybdenum by a d.c. sputtering method. The molybdenum electrode is electrically connected to the housing 5 by means of a column or wire 12 of solder, conductive epoxy adhesive or other suitable conductive material.

In order to connect a coaxial cable to the connector, the outer jacket, shield and dielectric are cut back by appropriate amounts and the cable inserted into the connector so that the exposed end of the internal conductor is located within the hollow interior of the pin 3, the dielectric abuts the rear end of the spacer 6 and the exposed shield is located within the solder impregnated braid 8. The connector is then briefly heated, for example by means of a hot-air gun, to fuse the solder rings 4 and 9 and to form solder connections between the pin 3 and central conductor and between the braid 8 and coax cable shield.

The connector will function exactly as a standard coaxial connector until the connected cable experiences a voltage transient whereupon the potential difference across the thickness of the glass layer 11 will cause the glass to become electrically conductive and form a closed circuit between the central conductor and the shield.

Referring to FIGS. 2 and 3, a mass termination connector such as that described in British Patent No. 1,522,485 (the disclosure of which is incorporated herein by reference) is schematically shown.

The connector comprises a connector housing 21 and a pair of connector wafers 22 and 23 that can be inserted into the housing. Each wafer 22,23 has a number of (usually 25 or 50) metallic electrical conductors 24 extending therethrough which terminate at one end either in the form of pins 25 or complementary "tuning fork" female contacts and at the other end in the form of contacts 26 for connection to a flat cable or to a number of small single conductor wires. The particular means used for connecting the conductors 24 to the wires or flat cable is not shown but usually comprises one or more solder devices for example as described in U.S. Pat. Specification No. 3,852,517.

In each of the wafers 22 and 23 a stepped recess 27 is made that extends across the width of the entire wafer to expose each of the conductors. In one embodiment of this connector, a molybdenum electrode is deposited 10 micrometer thick layer 28 of the selenium-germanium-arsenic glass described above, and a thin electrode 29 formed e.g. from molybdenum, gold or aluminium is deposited on top of the glass layer 28. An additional conductive layer 30 or "ground plane" of gold or aluminium is deposited on the wafer material in the stepped recess 27, the ground plane being electrically earthed for example to the metallic housing of the connector or to an earth pin. Each electrode 29 is connected to the ground plane by means of a wire 31 formed from e.g. gold or aluminium and bonded to the electrode 29 and ground plane 30 by conventional wire bonding techniques.

Alternatively, a single layer 28 of the glass and electrode 29 may be deposited across the entire width of the wafer in which case only a single wire 31 is necessary for connection to the ground plane, or the ground plane and wire can even be dispensed with if one of the conductors 24 is earthed.

In an alternative construction, the selenium-germanium-arsenic glass layer and electrodes are deposited onto the common ground plane 30, and the wires 31 connect the conductors 24, after any appropriate surface preparation if necessary, with the electrode of the glass layer.

Figure 4:
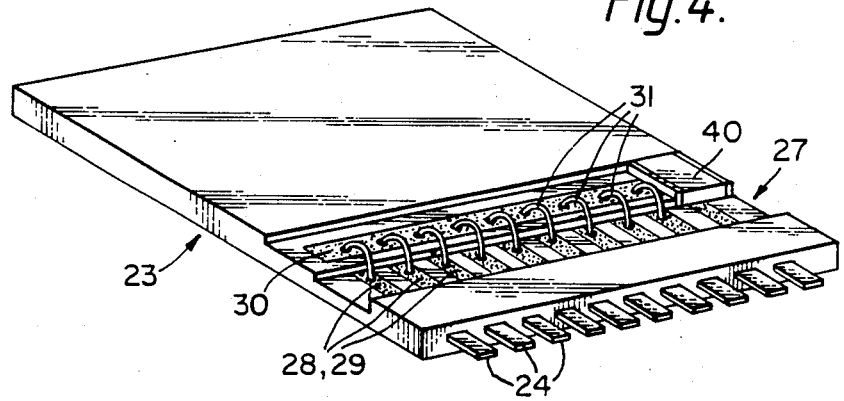
FIG. 4 is a perspective view of a modification of the wafers shown in FIG. 2.

FIG. 4 shows schematically a further modification of the wafer shown in FIGS. 2 and 3. In this form of wafer the glass layers 28 and electrodes 29 are deposited on the conductors 24 as described above and are electrically connected to a ground plane 30 by means of wires 31. In addition, however, a 1.6 microfarad capacitor 40 is located in the recess 27 and is or housing of the connector. In this form of device any transient current having a frequency spectrum above about 100KHz is conducted directly to earth while any direct currents or alternating currents of frequencies significantly lower than about 100KHZ are blocked by the capacitor. This modification of the device has the advantage that it reduces or eliminates the possibility of the glass switching layers 28 being held in their low resistance state by the direct currents in the electrical system after the transient has been transmitted to earth.

Figure 5:
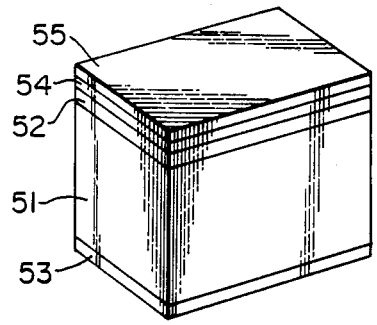
FIG. 5 is a schematic view of a capacitor that incorporates a circuit protection device according to the invention.

FIG. 5 shows schematically a circuit protection device according to the invention that may be incorporated into any larger electrical component. The device comprises a capacitor 51 having a capacitance for example of 0.5 to 3 microfarads (although larger or smaller capacitances may be desired in many circumstances) which is provided with terminals 52 and 53. A 10 micrometer thick layer 54 of the selenium-germaniumarsenic glass switching material described above is deposited on the terminal 52 for example by a vapor deposition method and then a thin electrode 55 for example formed from molybdenum is deposited on the glass layer 54 e.g. by a d.c. sputtering technique. Additional metal layers may be provided on top of the electrode 55 in order to improve the formation of solder joints if desired. As described above and in our copending Patent Application entitled "overvoltage protection device" filed on even date herewith (Agent's ref. RK269) the glass layer will become conductive when the circuit is exposed to a transient having a high frequency spectrum, e.g. above 100KHz, to allow the transient to be passed to earth, but the capacitor will exhibit a high impedance to lower frequency signals and therefore prevent such signals latching the glass layer 54 in its low resistance state.

Figure 6:
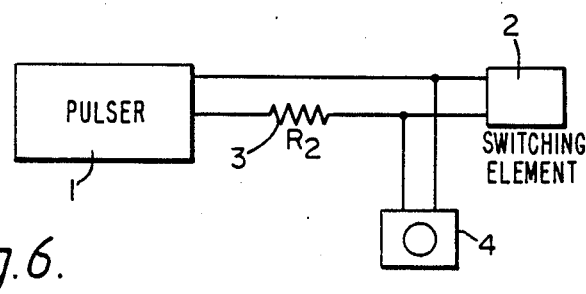
FIG. 6 is a diagram of a circuit used to determine the energy to latch of the materials and devices according to the invention.

FIG. 6 is a diagram of a circuit used to determine the energy to latch, which comprises pulser 56, switching element 57 made according to this invention, resistor 58 and meter 59.

Figure 7:
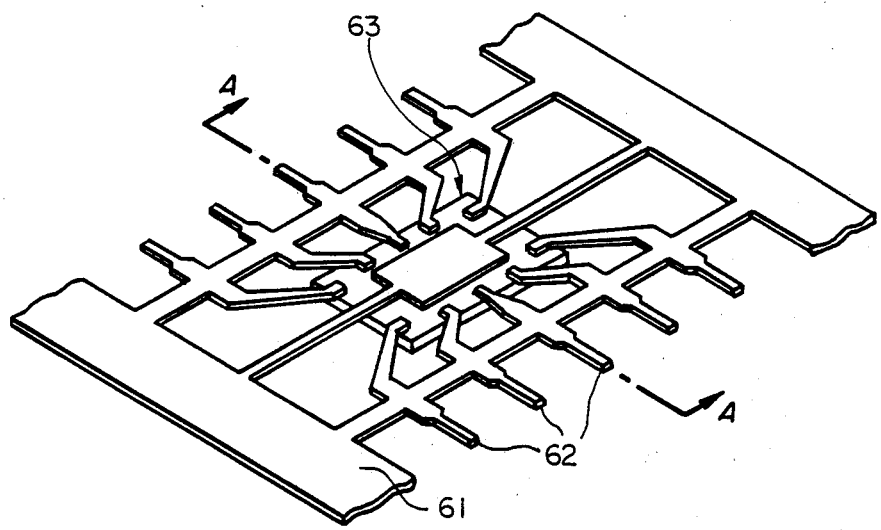
FIGS. 7-13, 10a, 10b show alternate embodiments.
Figure 8:
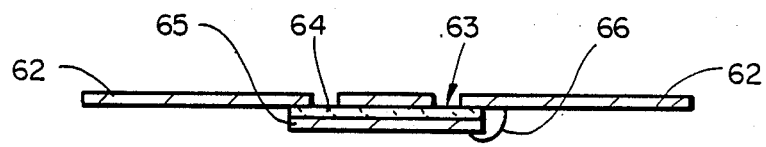
Figure 9:
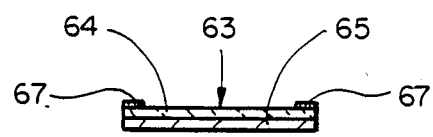

FIG. 7 illustrates how a threshold device of this invention can be employed to provide circuit protection for an integrated circuit (IC) chip package assembly through the lead frame used in the package. In FIG. 7 lead frame 61 is shown in its tape form as typically used in automated equipment for assembly of lead frame IC packages. Leads 62 extend from the exterior of the package to the center portion of the package where each lead is connected to a pad of an integrated circuit chip, typically by wire bonding the chip pads to the ends of the leads in the center portion of the package. Circuit protection device 63 is shown in A—A cross-section in FIG. 8 and comprises a glass layer 64 which is deposited on or bonded to leads 62 and an electrode layer 65 which serves as the ground plane which can be connected to an earth lead in any convenient manner such as wire bond 66 in FIG. 8. As illustrated above in FIGS. 4 and 5, a capacitor element may be included in the structure of FIGS. 7 and 8. Circuit protection device 63 may be constructed as a tape having glass layer 64 and electrode layer 65 and having a conductive pressure sensitive adhesive areas on the surface of glass layer 64 whereby the circuit protection device 63 can be placed on lead frame 61 and connected to all of the leads 62 by the conductive pressure sensitive adhesive. As shown in FIG. 9 the circuit protection device 63 would comprise electrode layer 65, glass layer 64 and areas 67 which are conductive pressure sensitive adhesive areas adapted for attaching the device to leads 62 in lead frame 61. The lead frames to which such a circuit protection device can be applied may be made in any desired shape as dictated by the IC chip package design. For example, see U.S. Pat. No. 4,012,766 which illustrates one of the numerous lead frame chip package designs. The conductive pressure sensitive adhesive 67 can be applied in a pattern corresponding to the leads to which the threshold circuit protection device is to be attached. Alternatively the conductive pressure sensitive adhesive could be applied to the leads and then the threshold circuit protection device 63 attached to those leads. In another form, a pressure sensitive adhesive which can be used to attach the circuit protection device 63 glass layer 64 to the conductive leads 62 is a uniaxially conductive adhesive. The uniaxial conductivity can be due to the nature of the material or due to the material being deposited on the circuit protection device in individual islands or small dots such that each dot will be conductive between the glass layer 64 and a lead 62 but the layer of material would not be continuous, i.e. the small dots or individual islands of conductive material or adhesive do not contact each other and therefore are not conductive between the various leads 62.

Figure 10:
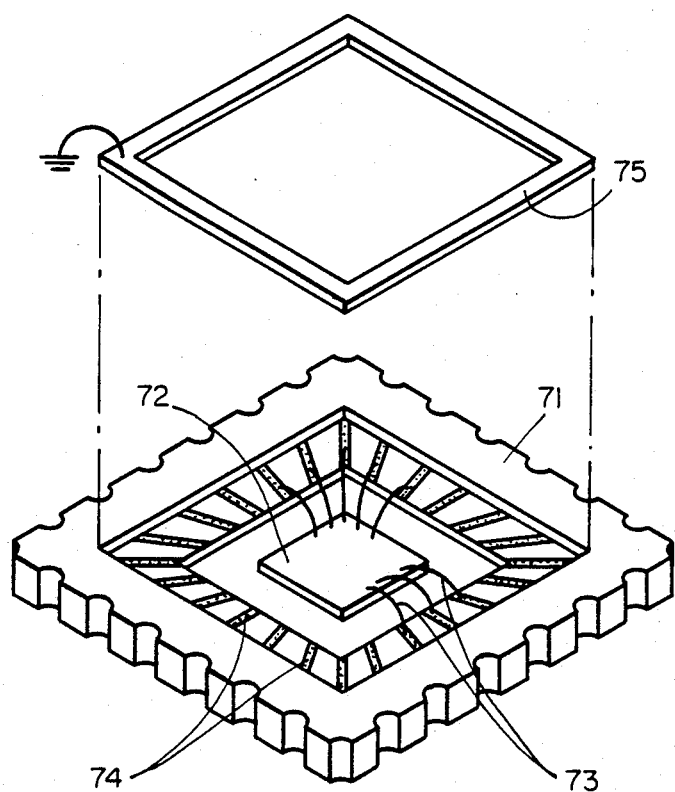

FIG. 10 shows the use of a threshold circuit protection device according to the present invention on a chip carrier 71 containing a chip 72. The conductive I/0 pads of chip 72 are wire bonded by wires 73 to conductive pads 74 in the chip carrier. The theshold circuit protection device 75 comprises a glass layer which contacts the conductive pads 74 of the chip carrier and an electrode layer in contact with the glass which can be grounded to earth through an appropriate earthpad in the chip carrier or any other appropriate point in the chip package. The threshold circuit protection device 75 covers a portion of the pad 74 of chip carrier 71 leaving a portion of each pad 74 available for wire bonding of the chip 72 with wires 73. The threshold circuit protection device 75 can be formed in situ on chip carrier 71 by first depositing the glass layer, for example by vapor deposition, on the appropriate areas of the conductive pads 74 of the chip carrier and then depositing the electrode layer on top of the glass, which in turn can be connected to earth through a separate wire bond to an earth pad or chip package frame. Alternatively the glass layer can be omitted from an appropriate pad on the chip carrier thereby permitting the electrode layer to be deposited on the glass and on and in contact with that pad which will serve as an earthing pad. As with the lead frame of FIG. 7, the circuit protection device in the chip carrier of FIG. 10 allows all of the in/out circuits to be in contact with the glass layer which glass is in turn in contact with a ground plane. Thus any overvoltage which enters the package through any lead or I/0 pad can immediately pass through the glass layer to the ground plane. As mentioned above, any appropriate elements such as the capacitor of FIGS. 4 or 5 may also be built into the combination of the circuit protection device and the chip carrier. As in FIG. 9 the circuit protection device 75 can be connected to pads 74 by conductive adhesive or other appropriate means.

Figure 10A:
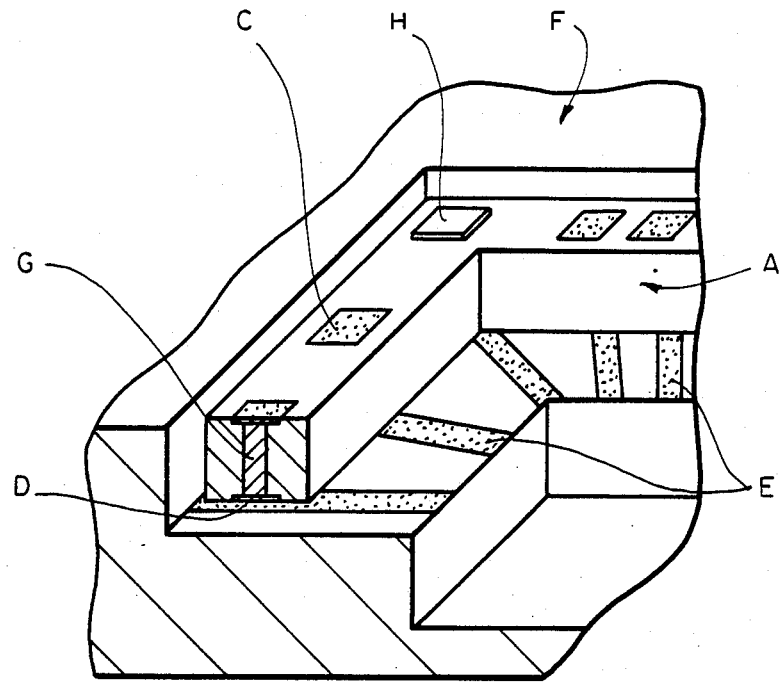
Figure 10B:
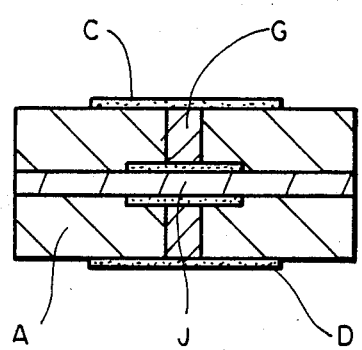

FIG. 10a shows a further modification of FIG. 10. Here the frame A used to support the circuit protection device is multilayered. An electrode pattern C, D is produced on both top and bottom faces of the frame A to match the electrodes E of the chip carrier F. The two electrodes on opposite faces of the frame A are interconnected by a conducting channel or via G. The circuit protection device H is built up on the top electrode pattern C of the frame A and when completed the frame can be fitted into the chip carrier as in FIG. 10. It is also possible, as shown in FIG. 10b, to incorporate within the frame material the elements of a capacitor J which is across the via G. This system of assembly provides for a more robust package since the circuit protection device is separated from the electrode tracks of the chip carrier by the conducting via's.

Figure 11:
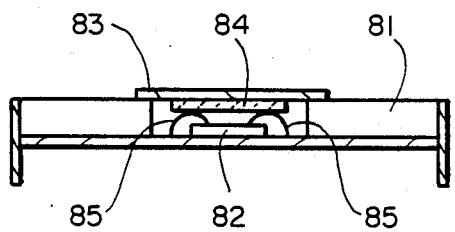

FIG. 11 is a schematic representation of a cross-section of a lead frame package 81 containing chip 82 protected by cavity cover 83 where cavity cover 83 is also connected to earth. Cavity cover 83 has on the interior surface a layer of glass 84 according to the present invention. Wires 85 which form the wire bonds from chip 82 to the appropriate leads in lead frame 81 are of sufficient length to contact glass layer 84 on cover 83. In this configuration any overvoltage which enters through any lead in the lead frame and any bonding wire 85 will cause the glass layer 84 to become conductive thus allowing the transient voltage and current to be passed to earth through cover 83.

Figure 12:
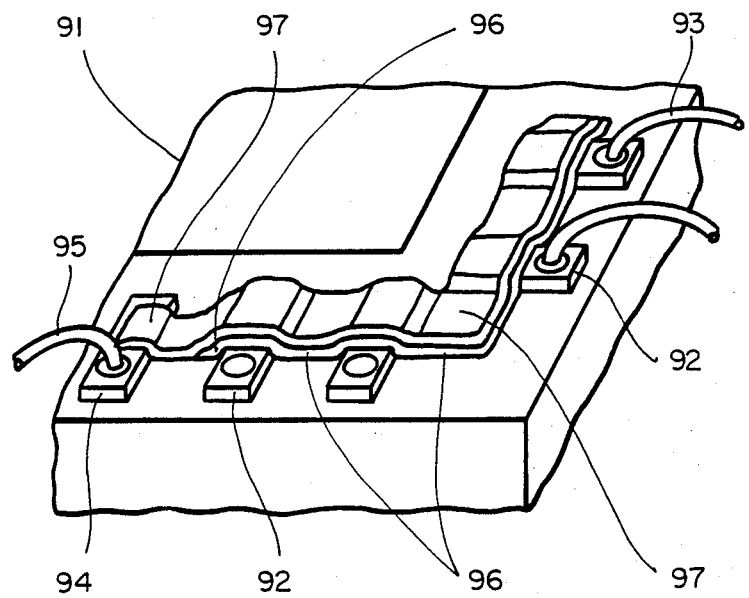

FIG. 12 is a schematic diagram of a corner portion of an integrated circuit chip 91 which has wire bonding pads 92 to which wires 93 are bonded to connect the IC chip to some other electrical component such as a chip carrier or substrate. In this FIG. 12 illustration pad 94 and wire 95 are to be connected to earth. Chalcogenide glass layer 96 is deposited across pads 92. A conductive metallic layer 97 is then deposited on glass layer 96 and the conductive layer 97 extends to and makes electrical contact with earthing pad 94. In this configuration any transient current or overvoltage which enters through any pad 92 will cause glass layer 96 to become conductive at that pad and the transient current will be conducted into the conductive metallic layer 97 and to earth through pad 94 and wire 95.

Figure 13:
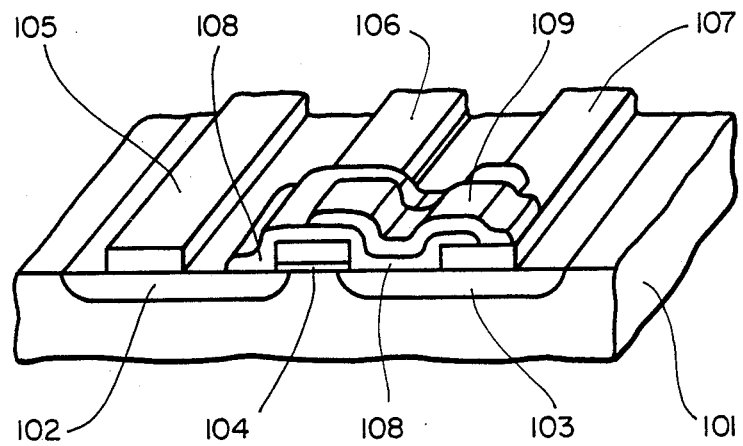

FIG. 13 is a schematic representation of an internal portion of a metal oxide semiconductor (MOS) which typically comprises a silicon substrate 101, a source area 102 and drain area 103 with gate 104 between the source and drain. The source contact 105, the gate contact 106 and the drain contact 107 are typically conductive metal lines which have been deposited on the source, gate and drain areas. In this particular example of a circuit protection device, it is desired to protect gate 104 from overvoltage which is provided by chalcogenide glass layer 108 which is deposited on gate contact 106 and partially on drain contact 107. A conductive metallic layer 109 is deposited on the glass layer 108 over the area of gate contact 106 and beyond the glass area 108 to make direct contact with drain contact 107. In this configuration the circuit protection device according to the present invention is provided by glass layer 108 and electrode layer 109 whereby any overvoltage in gate contact 106 causes the glass layer 108 to become conductive and the transient current is conducted through metallic layer 109 to drain contact 107 thus protecting the gate 104 part of the circuit.

As can be seen from the illustrations in FIGS. 12 and 13, it is possible to design the circuit protection devices according to this invention to protect an entire integrated circuit chip or to protect selected portions of internal circuits in an IC chip, for example a MOS. Furthermore the protection can be provided in any desired configuration whether by conducting the transient current or overvoltage to an earth connection or simply diverting such overvoltage or transient current from a sensitive part of a circuit to a non-sensitive part of the circuit, thereby providing the desired circuit protection.

The following Examples illustrate the invention:

Samples of a number of chalcogenide glass compositions were prepared by mixing the components, which were of at least 99.99% purity, and melting the mixture in a silica ampoule under a vacuum or under reduced argon pressure. During melting, which was carried out at tempertures of up to 1000° C. and for periods of up to 48 hours depending on the composition, the ampoule was rocked and rotated in order to ensure that a homogeneous melt was obtained.

A 10 micrometer thick film of the glass so prepared was deposited onto a lower molybdenum electrode by vapor deposition at a pressure of $10^{-3}$ to $10^{-4}$ Pa using either a resistance heated, or an electron beam heated, source. Deposition rates of 0.3 to 1.0 micrometers per minute were employed. An upper molybdenum electrode of 1mm² area was deposited by d.c. sputtering in argon at a pressure of 10 Pa and at a deposition rate of 20 to 30 micrometres per minute.

The glasses had the compositions shown in Table I.

TABLE I

| | Components (Parts by mole) | | | | |
|---|---|---|---|---|---|
| Example | Si | Ge | As | Se | Te |
| 10 (Comparison) | 12 | 10 | 30 | | 48 |
| 2. (comparison) | | | 20 | 80 | |
| 3. (comparison) | | | 40 | 60 | |
| 4. | | 7 | 37 | 56 | |
| 5. | | 7 | 56 | 37 | |
| 6. | | 10 | 20 | 70 | |
| 7. | | 14 | 34 | 52 | |
| 8. | | 14 | 52 | 34 | |
| 9. | | 20 | 20 | 60 | |
| 10. | | 20 | 60 | 20 | |
| 11. | | 22 | 30 | 48 | |
| 12. | | 27 | 51 | 22 | |
| 13. | | 40 | 19 | 41 | |
| 14. (comparison) | | 14 | 34 | | 52 |
| 15. (comparison) | | 14 | 43 | | 43 |
| 16. (comparison) | | 14 | 34 | 26 | 26 |
| 17. (comparison) | | | 40 | 40 | 20 |
| 18. (comparison) | | | 40 | 20 | 40 |

The electrical properties of the compositions are shown in Table II and of the devices formed from them are shown in Table I.

TABLE II

| Example | Energy to Latch (Jm$^{-1}$) | off (ohm m) | threshold field strength (MVm$^{-1}$) | r | Figure of merit (kgm$^3$s$^{-2}$A$^{-1}$) |
|---|---|---|---|---|---|
| 1.(comparison) | 100 | 1 × 10$^5$ | 45 | 10 | 0.02 |
| 2.(comparison) | 2000 | 1 × 10$^6$ | 7.5 | 6.7 | 39 |
| 3.(comparison) | 2000 | 1 × 10$^6$ | 7.0 | 6.8 | 42 |
| 4. | 5000 | 3 × 10$^5$ | 10.0 | 7.0 | 22 |
| 5. | 7000 | 1 × 10$^6$ | 11.0 | 6.9 | 92 |
| 6. | 4000 | 1.5 × 10$^6$ | 9.0 | 6.8 | 98 |
| 7. | 15000 | 1.5 × 10$^6$ | 13.0 | 6.4 | 270 |
| 8. | 20000 | 6 × 10$^5$ | 14.0 | 6.6 | 130 |
| 9. | 5000 | 1 × 10$^6$ | 10.0 | 6.4 | 78 |
| 10. | 20000 | 1 × 10$^6$ | 16.0 | 6.7 | 186 |
| 11. | 30000 | 1 × 10$^6$ | 25.0 | 6.7 | 179 |
| 12. | 18000 | 1.2 × 10$^6$ | 16.0 | 6.8 | 198 |
| 13. | 5000 | 1 × 10$^6$ | 14.0 | 6.8 | 52 |
| 14.(comparison) | 3000 | 1 × 10$^4$ | 9.0 | 12.2 | 0.3 |
| 15.(comparison) | 6000 | 3 × 10$^3$ | 14.0 | 13.3 | 0.1 |
| 16.(comparison) | 6000 | 1 × 10$^4$ | 12.0 | 9.5 | 0.6 |
| 17.(comparison) | 2000 | 1 × 10$^5$ | 8.0 | 8.7 | 2.9 |
| 18.(comparison) | 50 | 5 × 10$^4$ | 10.0 | 9.7 | 0.3 |

TABLE III

| Example | Energy to Latch (mJ) | off resistance (M ohm) | Threshold Voltage (V) | Capacitance (pF) | Figure of Merit |
|---|---|---|---|---|---|
| 1.(comparison) | 1 | 1 | 450 | 8.8 | .25 |
| 2.(comparison) | 20 | 10 | 75 | 5.9 | 452 |
| 3.(comparison) | 20 | 10 | 70 | 6.0 | 476 |
| 4. | 50 | 3 | 100 | 6.2 | 242 |
| 5. | 70 | 10 | 110 | 6.1 | 1043 |
| 6. | 40 | 15 | 90 | 6.0 | 1111 |
| 7. | 150 | 15 | 130 | 5.6 | 3091 |
| 8. | 200 | 6 | 140 | 5.8 | 1478 |
| 9. | 50 | 10 | 100 | 5.6 | 893 |
| 10. | 200 | 10 | 160 | 5.9 | 2119 |
| 11. | 300 | 10 | 250 | 5.9 | 2034 |
| 12. | 180 | 12 | 160 | 6.0 | 2250 |
| 13. | 50 | 10 | 140 | 6.0 | 595 |
| 14.(comparison) | 30 | 0.1 | 90 | 10.7 | 3.1 |
| 15.(comparison) | 60 | 0.03 | 140 | 11.7 | 1.1 |
| 16.(comparison) | 60 | 0.1 | 120 | 8.4 | 6.0 |
| 17.(comparison) | 20 | 1 | 80 | 7.7 | 32.5 |
| 18.(comparison) | 5 | 0.5 | 100 | 8.5 | 2.9 |

The energy to latch of the device, and hence of the glass material, was measured by means of a circuit as shown in FIG. 6. Single shot pulses generated by means of a pulser 1 were passed to the switching element 2 connected in series with a current limiting resistor 3 having a resistance R$_2$ of from 40 to 100 ohms and the voltage across the switching element was observed by means of oscilloscope 4. The voltage generated by the pulser 1 was gradually increased (about 5 to 10 pulses being passed for each voltage level from the pulser) until the switching element latched in its low resistance state (determined by subsequently measuring its resistance. The energy to latch the device, E$_L$ was determined by the equation:

$$E_L = J \cdot \frac{V^2}{(1000)} \cdot \frac{R_1}{(R_1 + R_2)}$$

where

J is the energy available from the pulser;
V is the peak voltage from the pulser when latching occurred;
R$_1$ is the internal output impedance of the pulser (5 ohms); and
R$_2$ is the resistance of the current limiting resistor.

This equation gives very good agreement with values obtained by integrating the current and voltage curves of the pulses.

We claim:

1. An integrated circuit chip package which comprises
   (1) a lead frame;
   (2) an integrated circuit chip protected by a cavity cover comprising an electrode; and
   (3) a threshold switching device for protecting the integrated circuit from a voltage transient, the switching device including a switching element formed from an amorphous composition comprising:
      (a) 15 to 75 atomic % selenium;
      (b) 10 to 65 atomic % arsenic; and
      (c) 5 to 42 atomic % germanium, or if the composition contains less that 35 atomic % selenium, 5 to 35 atomic % germanium;
   in which the proportions of (a), (b) and (c) (based on the total of (a), (b) and (c)) add up to 100%;
   the composition having not more than 10 atomic % tellurium; and
   the electrode being connectable to earth and an internal surface of the electrode being connectable to the composition and the chip being connected to the lead frame by wire bonds, the wire bonds being such that they contact said composition.

2. An integrated circuit chip package which comprises (1) a chip carrier having first conductive pads which can be wire bonded to conductive pads of an integrated circuit chip;
(2) a threshold switching device for protecting the integrated circuit from a voltage transient, the switching device including a switching element formed from an amorphous composition comprising:
   (a) 15 to 75 atomic % selenium;
   (b) 10 to 65 atomic % arsenic; and
   (c) 5 to 42 atomic % germanium, or if the composition contains less that 35 atomic % selenium, 5 to 35 atomic % germanium;
   in which the proportions of (a), (b) and (c) (based on the total of (a), (b) and (c) add up to 100%;
   the composition having not more than 10 atomic % tellurium; and
   said composition being connected between (i) the first conductive pads of the carrier and an electrode layer which can be connected to earth;
the device being provided by a frame having electrode patterns on opposing surfaces each of which matches a pattern of electrodes on the chip carrier, one face contacting the chip carrier electrodes, the patterns on opposing faces being interconnected by a conductive channel of the frame, the device being built up at the electrode pattern at a face of the frame opposite to that which contacts the chip carrier electrodes.

3. A package according to claim 2, in which the frame incorporates a capacitor.

4. An integrated circuit chip package which includes a threshold switching device for protecting the integrated circuit from a voltage transient, the switching device including a switching element formed from an amorphous composition comprising:
   (a) 15 to 75 atomic % selenium;
   (b) 10 to 65 atomic % arsenic; and
   (c) 5 to 42 atomic % germanium, or, if the composition contains less that 35 atomic % selenium, 5 to 35 atomic % germanium;
   in which the proportions of (a), (b) and (c) (based on the total of (a), (b) and (c) add up to 100%;
   the composition having not more than 10 atomic % tellurium;
the package comprising:
   (a) a semiconductor comprising:
      (i) a source area and source contact;
      (ii) a drain area and drain contact;
      (iii) a gate between the source area and drain area and a gate contact;
   (b) the composition deposited across the gate contact and the drain contact; and
   (c) a conductive metal electrode layer deposited across said composition and onto the drain contact to contact the drain contact directly.

* * * * *

UNITED STATES PATENT AND TRADEMARK OFFICE
CERTIFICATE OF CORRECTION

PATENT NO. : 4,928,199

DATED : May 22, 1990

INVENTOR(S) : DIAZ ET AL.

It is certified that error appears in the above-identified patent and that said Letters Patent is hereby corrected as shown below:

In Column 1, line 11, replace "electri-" by --electrical--.

In Column 1, line 63, replace "suitabi lity" by --suitability--.

In Column 8, line 57, after "deposited" insert --onto the individual conductors 24 followed by a--.

In Column 9, lines 38 to 39, replace "selenium-germaniumar-senic" by --selenium-germanium-arsenic--.

In Claim 2, line 17 (column 15, line 15), replace "(c)" by --(c))--.

Signed and Sealed this

Sixth Day of July, 1993

Attest:

MICHAEL K. KIRK

Attesting Officer

Acting Commissioner of Patents and Trademarks